US009265124B2

United States Patent
Lin et al.

(10) Patent No.: US 9,265,124 B2
(45) Date of Patent: Feb. 16, 2016

(54) ELECTRONIC DEVICE AND CONTROL METHOD THEREOF

(71) Applicants: Yi-Hsun Lin, Taipei (TW); Feng-Wen Fu, Taipei (TW)

(72) Inventors: Yi-Hsun Lin, Taipei (TW); Feng-Wen Fu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 496 days.

(21) Appl. No.: 13/742,327

(22) Filed: Jan. 15, 2013

(65) Prior Publication Data

US 2014/0077708 A1   Mar. 20, 2014

(30) Foreign Application Priority Data

Sep. 18, 2012 (TW) .............................. 101134171 A

(51) Int. Cl.
  *H05B 37/02* (2006.01)
  *H02J 7/00* (2006.01)
  *H01L 31/053* (2014.01)
  *H05B 37/00* (2006.01)
  *H02J 7/35* (2006.01)

(52) U.S. Cl.
  CPC .............. *H05B 37/02* (2013.01); *H01L 31/053* (2014.12); *H02J 7/0052* (2013.01); *H05B 37/00* (2013.01); *H02J 7/35* (2013.01)

(58) Field of Classification Search
  None
  See application file for complete search history.

(56) References Cited

U.S. PATENT DOCUMENTS

| 8,856,576 | B2 * | 10/2014 | Stanley-Marbell | 713/340 |
| 9,046,281 | B2 * | 6/2015 | Curran | |
| 2008/0238345 | A1 * | 10/2008 | Jaan | 315/325 |
| 2010/0237785 | A1 * | 9/2010 | Lee | 315/150 |
| 2011/0062874 | A1 * | 3/2011 | Knapp | 315/158 |
| 2012/0307598 | A1 * | 12/2012 | Hasegawa | 368/66 |
| 2015/0091454 | A1 * | 4/2015 | McRae | 315/186 |

FOREIGN PATENT DOCUMENTS

| TW | 200928486 | 7/2009 |
| TW | 201021019 | 6/2010 |
| TW | M384353 | 7/2010 |

OTHER PUBLICATIONS

"Office Action of Taiwan Counterpart Application", issued on Apr. 14, 2014 p. 1-p. 5.

* cited by examiner

*Primary Examiner* — Lincoln Donovan
*Assistant Examiner* — Khareem E Almo
(74) *Attorney, Agent, or Firm* — Jianq Chyun IP Office

(57) ABSTRACT

An electronic device including a solar cell, an energy storage unit, a control unit, and a controlled unit is provided. The solar cell converts light energy to electric energy. The energy storage unit performs charging by the electric energy. The control unit determines the intensity of the light energy according to an energy value of the electric energy and generates a correction signal accordingly, wherein the energy value is a current value or a voltage value. The controlled unit controls a characteristic parameter according to the correction signal.

11 Claims, 2 Drawing Sheets

ELECTRONIC DEVICE AND CONTROL METHOD THEREOF

CROSS-REFERENCE TO RELATED APPLICATION

This application claims the priority benefit of Taiwan application serial no. 101134171, filed on Sep. 18, 2012. The entirety of the above-mentioned patent application is hereby incorporated by reference herein and made a part of this specification.

FIELD OF THE INVENTION

The present invention generally relates to an electronic device and a control method thereof, in particular, to an electronic device with a solar cell and a control method thereof.

DESCRIPTION OF RELATED ART

An electronic device may detect the intensity of light source, which may further be a reference of the light adjustment, through a disposition of an ambient light sensor (ALS). For example, a display panel of an electronic device may adjust the brightness of its backlight source based on the electric signal generated by the ambient light sensor. By that means, the display panel may adjust the backlight brightness in accordance with the intensity of light source so as to provide the greatest comfort to the user's eyes and to reduce eyestrain due to overuse under conditions of strong light or insufficient light.

Additionally, in the nighttime or insufficient light condition, a keyboard of the electronic device may also turn on the keyboard light source based on the electric signal generated by an ambient light sensor. By that means, the keys of the keyboard may emit the backlight in all kinds of color from the characters so as to continuously provide the function of the keyboard to the user in the darkness. On the other hand, in terms of the application of a light source, the electronic device may convert the solar energy to electric energy through a disposition of a solar cell. In such way, the electronic device may provide the required power to a system through the renewable energy, and thereby reducing the environmental pollution.

However, to attain the above adjustment and application of the light source at the same time, an ambient light sensor and a solar cell should be both configured in an electronic device, which leads to an increment of the hardware cost and the power consumption. Additionally, in terms of a backlight plate, OLED, and an electronic paper product with small sizes, there exist limitations in the application of an ambient light sensor. Moreover, during the usage of the ambient light sensor, different placement positions may cause the ambient light sensor to generate significant errors, wherein the maximum error is, for example, +/−25%.

SUMMARY OF THE INVENTION

Accordingly, the present invention is directed to an electronic device, which adjusts a light source by using electric energy generated from a solar cell and further reduces the number of the elements, hardware cost, and power consumption of itself.

The present invention is directed to a control method, which adjusts a characteristic parameter of a controlled unit by referencing electric energy generated by a solar cell and further enhances operational functionalities of an electronic device.

The present invention provides an electronic device including a solar cell, an energy storage unit, a control unit and a controlled unit. The solar cell converts light energy to electric energy. The energy storage unit performs charging by utilizing the electric energy. The control unit determines the intensity of the light energy according to an energy value of the electric energy and accordingly generates a correction signal. The controlled unit utilizes the correction signal to control a characteristic parameter of the controlled unit.

According to an embodiment of the present invention, the energy storage unit includes a power controller and a battery. The power controller is electrically connected to the solar cell, and the battery is electrically connected to the power controller. Additionally, the power controller performs charging on the battery by using the electric energy in a charging mode.

According to an embodiment of the present invention, the control unit includes a reference signal generator and a brightness corrector. The reference signal generator is electrically connected to the solar cell, and the brightness corrector is electrically connected to the reference signal generator. In an operation, the reference signal generator generates a reference signal according to the energy value of the electric energy. Moreover, the brightness corrector may generate the correction signal according to the reference signal.

According to an embodiment of the present invention, the controlled unit is a display, and the characteristic parameter includes the contrast, the grayscale, the brightness of an image and the brightness of a backlight source.

According to an embodiment of the present invention, the controlled unit is a keyboard, and the characteristic parameter includes the brightness of a keyboard light.

According to an embodiment of the present invention, the controlled unit includes a display and a keyboard, and the characteristic parameter includes the contrast, the grayscale, the brightness of an image and the brightness of a backlight source.

According to an embodiment of the present invention, the energy value is a voltage value or a current value.

The present invention provides a control method suitably applied to an electronic device, wherein the electronic device includes a solar cell and a controlled unit, and wherein the control method includes the following steps. Light energy is converted to electric energy by utilizing the solar cell. Charging is performed by utilizing the electric energy generated by the solar cell. The intensity of the light is determined according to an energy value of the electric energy and a correction signal is generated. Also, a characteristic parameter of the controlled unit is controlled by utilizing the correction signal.

Based on the above, the present invention utilizes electric energy generated by a solar cell to perform charging on an energy storage unit and controls a characteristic parameter of a controlled unit by utilizing the electric energy. By that means, as compared to the known art, an electronic device may adjust a light source without an arrangement of an ambient light sensor, and therefore it is advantageous for reducing the number of the elements, hardware cost, and power consumption of the electronic device. Furthermore, through the adjustment of the brightness by utilizing the solar cell, the maximum error therefrom may be less than the maximum error generated by the ambient light sensor and further enhance operational functionalities of the electronic device.

In order to make the aforementioned and other objects, features and advantages of this invention comprehensible, a preferred embodiment accompanied with figures is described in detail below.

DESCRIPTION OF THE EMBODIMENTS

Figure 1:
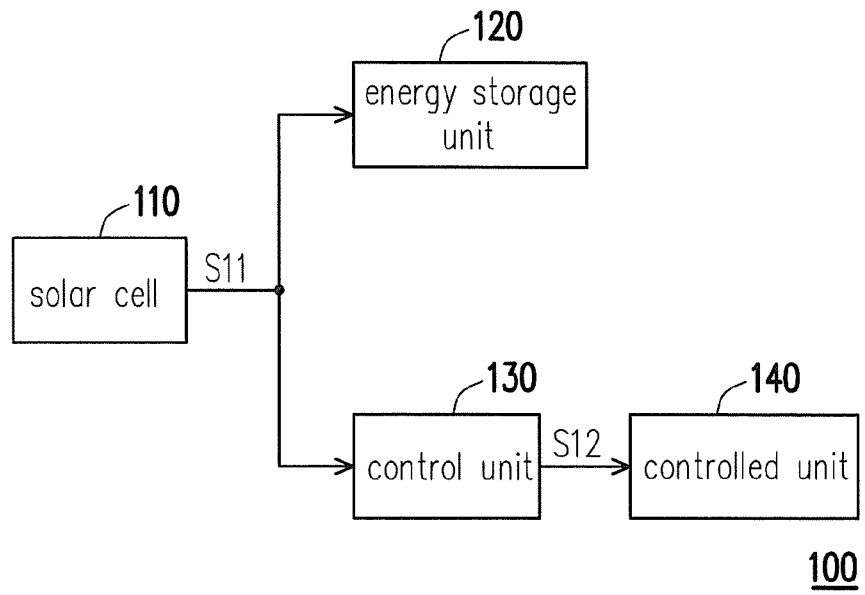
FIG. 1 is a block diagram of an electronic device in accordance with an embodiment in the present invention.

FIG. 1 is a block diagram of an electronic device in accordance with an embodiment in the present invention. Referring to FIG. 1, the electronic device 100 includes a solar cell 110, an energy storage unit 120, a control unit 130, and a controlled unit 140, wherein the energy storage unit 120 and the control unit 130 are electrically connected to the solar cell 110, and the controlled unit 140 are electrically connected to the control unit 130.

In the overall operation, the solar cell 110 may convert light energy to electric energy S11, and the energy storage unit 120 may perform charging by using the electric energy S11 from the solar cell 110, wherein the electric energy S11 is a charging current. For example, at the moment that the solar cell 110 is illuminated by a light source, it generates a corresponding current, wherein the generated current is proportional to the intensity of the light energy. Correspondingly, the energy storage unit 120 may perform charging by using the current generated from the solar cell 110. On the other hand, the control unit 130 may also receive the electric energy S11 from the solar cell 110. Also, it is known that the magnitude of the electric energy S11 is associated with the intensity of the light energy, and therefore the control unit 130 may determine the intensity of the light energy based on an energy value of the electric energy S11, wherein the energy value may be a current value or a voltage value. Moreover, the control unit 130 may further generate a corresponding correction signal S12 based on the determined result, and the controlled unit 140 may control a characteristic parameter therein based on the correction signal S12.

Along with different product designs, the control unit may be a brightness control unit, a contrast control unit, or a saturation control unit. Along with different control units, the correction signal may also be a brightness correction signal, a contrast correction signal, or a saturation correction signal. In the embodiments of the present invention, the control unit is a brightness control unit, and the correction unit is a brightness correction signal, and yet the present invention is not limited thereto.

For example, the controlled unit 140 may be a display. In the meantime, the display may adjust the contrast, greyscale, and brightness of an image displayed thereon by referring to the correction signal S12. The display may adjust the brightness of a backlight source thereof by also referring to the correction signal S12. In other words, when the controlled unit 140 is a display, the controlled characteristic parameter includes the contrast, greyscale, brightness of the image or the brightness of the backlight source. Additionally, the controlled unit 140 may also be, for example, a keyboard. By that means, the keyboard may timely turn on a keyboard light or adjust the brightness of the keyboard light by referring to the correction signal S12. In other words, when the controlled unit 140 is a keyboard, the controlled characteristic parameter may include the brightness of the keyboard light.

The controlled unit 140 illustrated above are composed of a single element, and yet a person having ordinary skill in the art may also expand the inner structure of the controlled unit 140 based on the required design specifications. For example, the controlled unit 140 may also be composed of a plurality of elements. For example, the controlled unit 140 may include a display and a keyboard at the same time. Meanwhile, the controlled characteristic parameter may include the contrast, greyscale, brightness of the image and the brightness of the keyboard light.

Speaking as a whole, the electronic device 100 not only uses the solar cell 110 to get the renewable energy, but also uses the electric energy S11 generated by the solar cell 110 to determinate the intensity of the light energy so as to control the characteristic parameter of the controlled unit 140. By that means, as compared to the known art, the electronic device 100 is only required to arrange the solar cell 110 so as to adjust and utilize the light source and further reduce the number of the elements, hardware cost, and power consumption of the electronic device 100. Moreover, the maximum error of the correction signal S12 generated by the control unit 130 may be less than the maximum error from an ambient light sensor, and therefore the electronic device 100 may more precisely adjust the characteristic parameter of the controlled unit 140.

Figure 2:
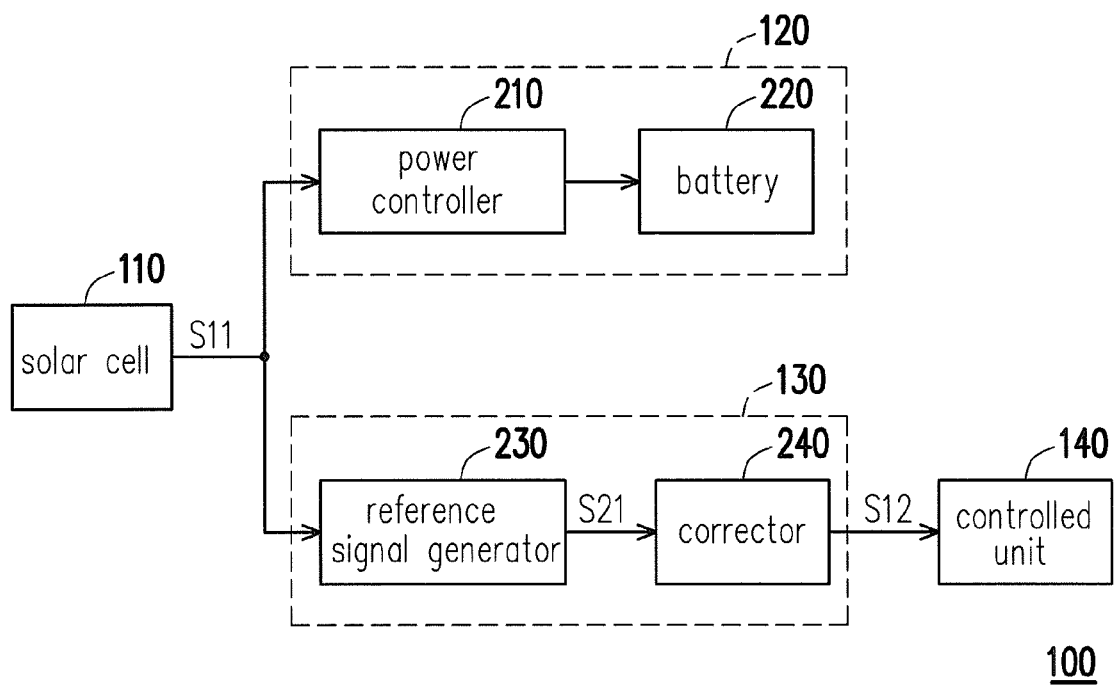
FIG. 2 is a block diagram in accordance with another embodiment in the present invention.

Hereinafter, the inner structures of the energy storage unit 120 and the control unit 130 will be further explained so that the person having ordinary skill in the art may understand more about the present invention. FIG. 2 is a block diagram in accordance with another embodiment in the present invention herein. As illustrated in FIG. 2, the energy storage unit 120 includes a power controller 210 and a battery 220, and the control unit 130 includes a reference signal generator 230 and a corrector 240.

In terms of the energy storage unit 120, the power controller 210 is electrically connected to the solar cell 110 for receiving the electric energy S11 from the solar cell 110. Additionally, the battery 220 is electrically connected to the power controller 210. By that means, the power controller 210 may charge the battery 220 by using the electric energy S11 in a charging mode. On the other hand, in terms of the control unit 130, the reference signal generator 230 is electrically connected to the solar cell 110, and the corrector 240 is electrically connected to the reference signal generator 230.

In an operation, the reference signal generator 230 may generate a reference signal S21 based on the energy value of the electric energy S11, wherein the energy value may be a voltage value or a current value. It should be noted that, since the energy value of the electric energy S11 is associated with the intensity of the light energy, the reference signal S21 generated by the reference signal generator 230 may also be associated with the intensity of the light energy. By that means, the corrector 240 may determine the intensity of the light energy based on the reference signal S21 and generate the corrector signal S12 based on the determined result so as to control the characteristic parameter of the controlled unit 140.

Figure 3:
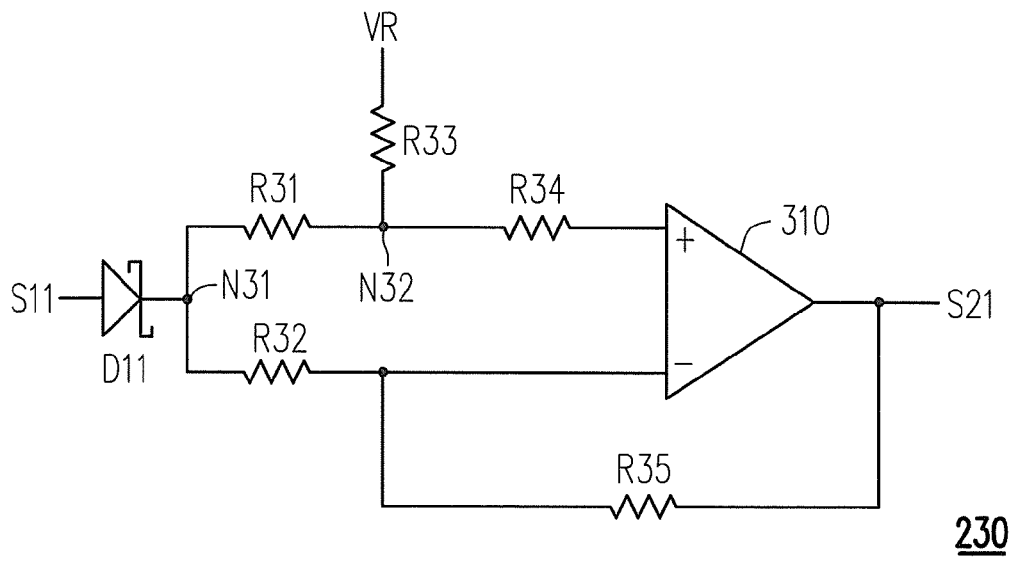
FIG. 3 is a circuit diagram of the reference signal generator 230 in accordance with an embodiment in the present invention.

FIG. 3 is a circuit diagram of the reference signal generator 230 in accordance with an embodiment in the present invention. Referring to FIG. 3, the reference signal generator 230 includes a Schottky diode D11, resistors R31~R35, and an operation amplifier 310, wherein an anode of the Schottky diode D11 receives the electric energy S11 from the solar cell

110, and a cathode of that is electrically connected to first ends of the resistors R31 and R32. A second end of the resistor R31 is electrically connected to first ends of the resistors R33 and R34, and a second end of the resistor R33 receives a preset voltage VR.

Moreover, a positive input terminal of the operation amplifier 310 is electrically connected to a second end of the resistor R34, and a negative input terminal of the operation amplifier 310 is electrically connected to a second end of the resistor R32. The resistor R35 is electrically connected between the negative input terminal and an output terminal of the operation amplifier 310. In the overall operation, the Schottky diode D11 rectifies the electric energy S11. Moreover, the operation amplifier 310 and the resistors R32~R35 may form a subtractor so as to subtract voltages on nodes N31 and N32. As a result, based thereon, the operation amplifier 310 may generate the reference signal S21 and provide the reference signal S21 to the corrector 240 at the back side. The embodiment in FIG. 3 illustrates a circuit structure of the reference signal generator, and yet the present invention is not limited thereto.

Figure 4:
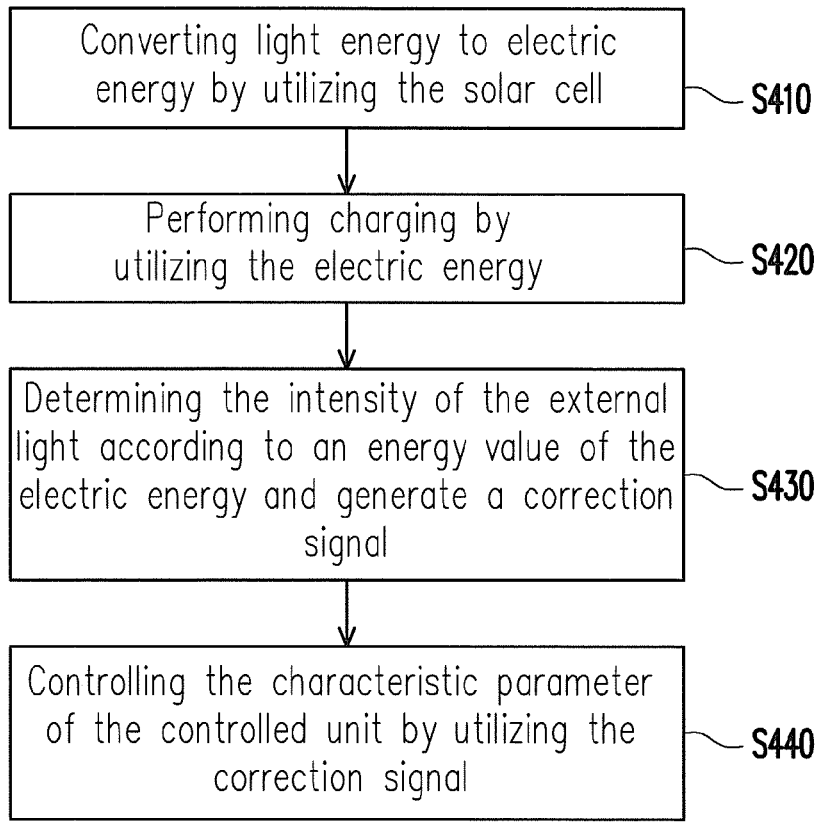
FIG. 4 is a flow diagram of a control method in accordance with an embodiment in the present invention

FIG. 4 is a flow diagram of a control method in accordance with an embodiment in the present invention, wherein the control method is suitably applied to an electronic device, and wherein the electronic device includes a solar cell and a controlled unit. Referring to FIG. 4, as illustrated in Step S410, the solar cell may be utilized for converting light energy to electric energy. Moreover, in terms of the electric energy generated by the solar cell, as illustrated in Step S420 and Step S430, the electric energy is utilized for charging an energy storage unit, and the intensity of the light energy is determined based on an energy value of the electric energy, and a correction signal is further generated. By that means, as illustrated in Step S440, the correction signal is utilized for controlling the characteristic parameter of the controlled unit. With regards to a detailed flow of each step in the embodiment in FIG. 4, it is included in each of the above embodiments and will not be described herein.

To sum up the above, the present invention utilizes electric energy generated by a solar cell to perform charging and determines light energy based on an energy value of the electric energy so as to control characteristic parameter of a controlled unit. By that means, an electronic device may adjust a light source without an arrangement of an ambient light sensor, and therefore it is advantageous for reducing the number of the elements, hardware cost, and power consumption of the electronic device. Furthermore, through the adjustment of the brightness by using the solar cell, the maximum error therefrom may be less than the maximum error generated by the ambient light sensor. Therefore, the present invention may adjust the characteristic parameter of the controlled unit more precisely and further enhance operational functionalities of the electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An electronic device comprising:
a solar cell, converting light energy to electric energy;
an energy storage unit, connected to the solar cell to perform charging by using the electric energy;
a control unit, connected to the solar cell to determine the intensity of the light energy according to an energy value of the electric energy and to generate a correction signal, wherein the control unit comprises:
a reference signal generator, electrically connected to the solar cell and generating a reference signal according to the energy value of the electric energy; and
a corrector, electrically connected to the reference signal generator and generating the correction signal according to the reference signal; and
a controlled unit, connected to the control unit and controlling a characteristic parameter based on the correction signal.

2. The electronic device of claim 1, wherein the energy storage unit comprises:
a power controller, electrically connected to the solar cell; and
a battery, electrically connected to the power controller,
wherein the power controller performs charging on the battery by using the electric energy in a charging mode.

3. The electronic device of claim 1, wherein the controlled unit is a display, and the characteristic parameter comprises a contrast, a grayscale, a brightness of an image or a brightness of a backlight source.

4. The electronic device of claim 1, wherein the controlled unit is a keyboard, and the characteristic parameter comprises a brightness of a keyboard light.

5. The electronic device of claim 1, wherein the controlled unit comprises a display and a keyboard.

6. The electronic device of claim 1, wherein the energy value is a voltage value or a current value.

7. A control method applicable to an electronic device, wherein the electronic device comprises a solar cell, a controlled unit, a reference signal generator and a corrector, and the control method comprises:
converting light energy to electric energy by utilizing the solar cell;
performing charging by utilizing the electric energy;
determining the intensity of the light according to an energy value of the electric energy;
generating a reference signal according to the energy value of the electric energy by utilizing the reference signal generator;
generating a correction signal according to the reference signal by utilizing the corrector; and
controlling a characteristic parameter based on the correction signal by utilizing the controlled unit.

8. The control method of claim 7, wherein the controlled unit is a display, and wherein the characteristic parameter comprises a contrast, a grayscale, and a brightness of an image, or a brightness of a backlight source.

9. The control method of claim 7, wherein the controlled unit is a keyboard, and the characteristic parameter comprises a brightness of a keyboard light.

10. The control method of claim 7, wherein the controlled unit comprises a display and a keyboard.

11. The control method of claim 7, wherein the energy value is a voltage value or a current value.

* * * * *